(12) United States Patent
Kawaguchi et al.

(10) Patent No.: US 6,339,557 B1
(45) Date of Patent: Jan. 15, 2002

(54) CHARGE RETENTION LIFETIME EVALUATION METHOD FOR NONVOLATILE SEMICONDUCTOR MEMORY

(75) Inventors: Tsutomu Kawaguchi, Nagoya; Shigemitsu Fukatsu, Okazaki; Mitsutaka Katada, Hoi-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/583,868

(22) Filed: May 31, 2000

(30) Foreign Application Priority Data

Jun. 2, 1999 (JP) .......................................... 11-154798

(51) Int. Cl.$^7$ .............................. G11C 7/04; G11C 16/04
(52) U.S. Cl. .................................. 365/211; 365/185.28
(58) Field of Search ................................. 365/211, 201, 365/185.28, 185.29, 185.26, 185.19

(56) References Cited

U.S. PATENT DOCUMENTS

| | | | |
|---|---|---|---|
| 5,279,981 A | * 1/1994 | Fukatsu et al. | 437/43 |
| 5,541,129 A | * 7/1996 | Tsunoda | 437/43 |
| 5,636,168 A | * 6/1997 | Oyama | 365/201 |
| 5,864,501 A | * 1/1999 | Lee | 365/185.09 |
| 5,901,080 A | * 5/1999 | Shaino | 365/185.09 |
| 6,002,609 A | * 12/1999 | Shinada | 365/185.04 |
| 6,054,351 A | * 4/2000 | Sato et al. | 438/264 |

FOREIGN PATENT DOCUMENTS

| | | |
|---|---|---|
| JP | 6-60700 | 3/1994 |
| JP | 8-138390 | 5/1996 |
| JP | 9-027198 | 1/1997 |
| JP | 9-097500 | 4/1997 |
| JP | 9-260613 | 10/1997 |
| JP | 11-204664 | 7/1999 |
| JP | 11-284040 | 10/1999 |
| JP | 11-306772 | 11/1999 |
| JP | 11-306773 | 11/1999 |

OTHER PUBLICATIONS

Katsumata et al., "Reliability evaluation of thin gate oxide using a flat capacitor test structure," Technical report of IEICE, SDM95–26 (May 1995), pp. 49–53.

Nozawa et al., "A thermionic electron emission model for charge retention in SAMOs structures," Japanese journal of applied physics, vol. 21, No. 2, (Feb., 1982), pp. L111–L112.

* cited by examiner

Primary Examiner—Richard Elms
Assistant Examiner—Anh Phung
(74) Attorney, Agent, or Firm—Law Office of David G. Posz

(57) ABSTRACT

In a nonvolatile semiconductor memory, a floating gate electrode is disposed above a silicon substrate between source and drain regions, through a tunnel film, and a control gate electrode is disposed above the floating gate electrode through an insulating film. The substrate is grounded and at least two negative voltages are respectively applied to the control gate electrode, so that a voltage is applied to the tunnel film. In these cases, charge retention properties are evaluated. The voltages applied to the control gate electrode are controlled so that the voltage applied to the tunnel film does not exceed a voltage applied to the tunnel film during a memory operation. A charge retention property when no voltage is applied across the control gate electrode and the substrate, i.e., when no voltage is externally applied to the tunnel film, is estimated by the charge retention properties when the two voltages are applied to the control gate electrode.

30 Claims, 9 Drawing Sheets

CHARGE RETENTION LIFETIME EVALUATION METHOD FOR NONVOLATILE SEMICONDUCTOR MEMORY

CROSS REFERENCE TO RELATED APPLICATION

This application is based upon and claims the benefit of Japanese Patent Application No. 11-154798 filed on Jul. 2, 1999, the contents of which are incorporated herein by reference.

BACKGROUND OF THE INVENTION

1. Field of the Invention

This invention generally relates to a reliability test, and particularly relates to a charge retention lifetime evaluation method for a nonvolatile semiconductor memory.

2. Description of the Related Art

FIG. 8 shows an example of anonvolatile semiconductor memory such as a flash memory or an EPROM. Memory cells 100 are arranged in a matrix. Each memory cell 100 constitutes several bits. FIG. 9 shows a basic constitution of each memory cell 100.

In the memory cell 100, a source region 21 and a drain region 22 are provided in a surface portion of a semiconductor substrate 20 separately from each other. A floating gate electrode 24 is disposed above the semiconductor substrate 20 between the regions 21 and 22 through a tunnel film 23. Further, a control gate electrode 26 is disposed above the floating gate electrode 24 through an insulating film 25 interposed therebetween. The drain region 22 is connected to a bit line, the source region 21 is connected to a source line, and the control gate electrode 26 is connected to a word line.

To read data in the memory cell, as shown in FIG. 9, a positive voltage of 1 to 2 V is applied to the drain region 22, the source region 21 is grounded, and voltage Vcc is applied to the control gate electrode 26. Accordingly, it is detected whether a channel current flows or not.

To write data in the memory cell, as shown in FIG. 10, voltage Vcc (for instance 5.5 V) is applied to the drain region 22, the source region 21 is grounded, and high voltage Vpp (for instance, +12 V) is applied to the control gate electrode 26. Accordingly, hot electrons are generated around the drain region 22, and are injected into the floating gate electrode 24 to increase a threshold voltage of the memory cell.

To erase data, as shown in FIG. 11, high positive voltage Vpp (for instance, +12 V) is applied to the source region 21, and the control gate electrode 26 is grounded. Accordingly, electrons are extracted from the floating gate electrode 24 into the source region 21. At that time, the drain region 22 is opened. Alternatively, electrons may be extracted from the floating gate electrode 24 into the substrate 20 due to a tunnel effect as shown in FIG. 12. In FIG. 12, a negative high voltage (for instance, −8 V) is applied to the control gate electrode 26, and a high positive voltage (for instance, +10 V) is applied to both the source region 21 and the substrate 20.

This type of nonvolatile semiconductor memory is evaluated by reliability tests. One such test is a charge retention lifetime evaluation test (memory holding time test). A flash memory is, for instance, required to have high charge retention characteristics of more than 10 years at 125° C. Therefore, evaluating the charge retention lifetime requires a long time even at a development stage, and a very high evaluation ambient temperature accelerates the evaluation speed.

However, there is a case where the evaluation ambient temperature cannot be set so high. In addition, when the charge retention lifetime is evaluated at approximately 250° C. or more after rewriting, damage caused to the tunnel film (film 23 in FIG. 9) by rewriting is recovered to prevent the charge retention lifetime from being evaluated accurately. That is, the accelerated heating accompanied by the recovery of tunnel film damage is not preferable for charge retention lifetime evaluation purposes.

SUMMARY OF THE INVENTION

The present invention has been made in view of the above problems. A first object of the present invention is to provide a method for evaluating a charge retention lifetime of a nonvolatile semiconductor memory for a short time regardless of an evaluation ambient temperature. A second object of the present invention is to provide a method for evaluating a charge retention lifetime of a nonvolatile semiconductor memory for a short time accurately.

In a charge retention lifetime evaluation method for a nonvolatile semiconductor memory according to the present invention, a charge retention lifetime is evaluated by externally applying a tunnel film voltage to a tunnel film. Therefore, the charge retention lifetime can be evaluated for a short time due to an accelerated evaluation, in which the voltage is intentionally applied to the tunnel film.

Preferably, first and second voltages different from each other are applied as the tunnel film voltage, and the charge retention lifetime when no voltage is externally applied to the tunnel film is estimated. The tunnel film voltage is preferably smaller than a voltage applied to the tunnel film at each operation for reading, writing, and erasing.

Preferably, an electric potential of a control gate electrode is set to be lower than that of a semiconductor substrate so that the tunnel film voltage is applied to the tunnel film. More preferably, a negative voltage is applied to the control gate electrode while making the semiconductor substrate grounded.

The charge retention lifetime can be evaluated in a temperature range at which damage generated in the tunnel film for writing data is not recovered. Accordingly, the charge retention lifetime can be evaluated for a short time accurately.

The charge retention lifetime can be evaluated in an operational temperature range at which the nonvolatile semiconductor memory is used in practice. Accordingly, the charge retention lifetime can be evaluated for a short time accurately. In this case, it is more preferable for a practical use to apply the voltage to the tunnel film at the maximum temperature in the operational temperature range.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

Figure 1:
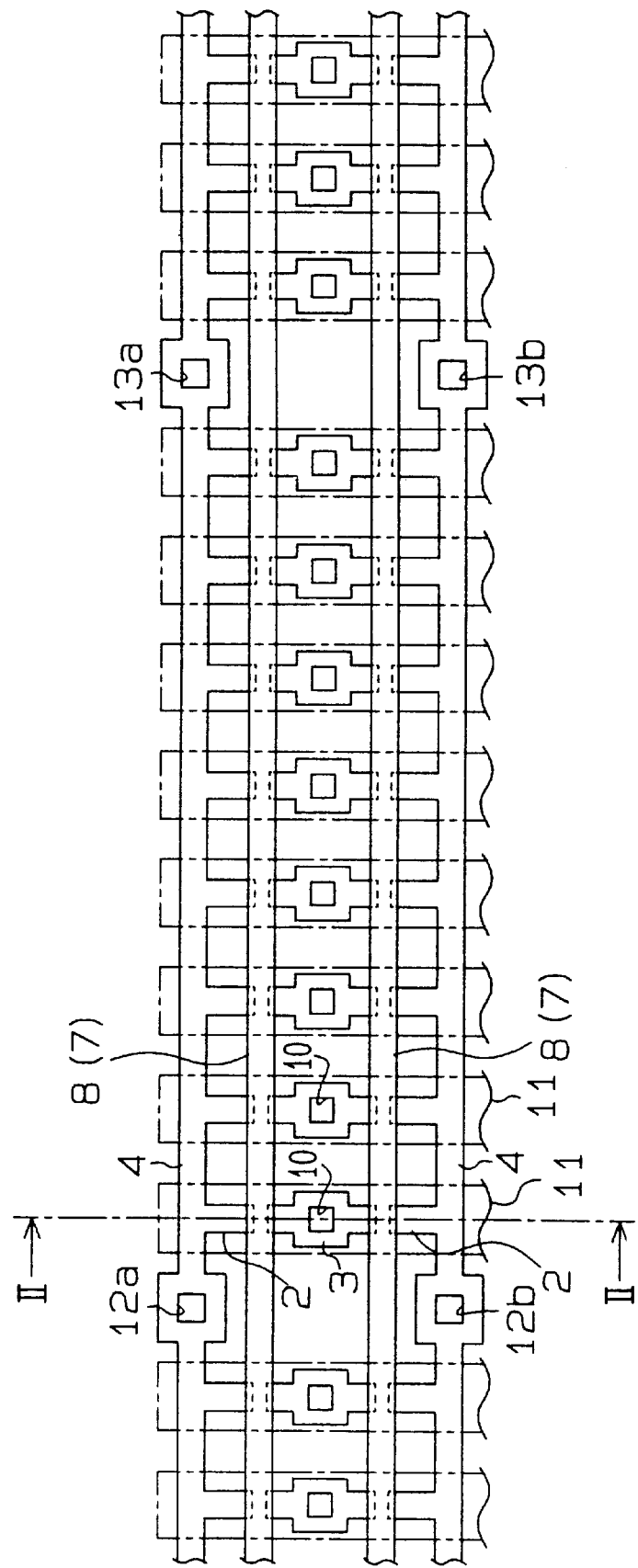
FIG. 1 is a plan view showing a flash memory in a preferred embodiment.

A preferred embodiment of the present invention is explained referring to the appended drawings. FIG. 1 is a plan view showing a flash memory, and FIG. 2 is a cross-sectional view taken along line II—II in FIG. 1.

Figure 2:
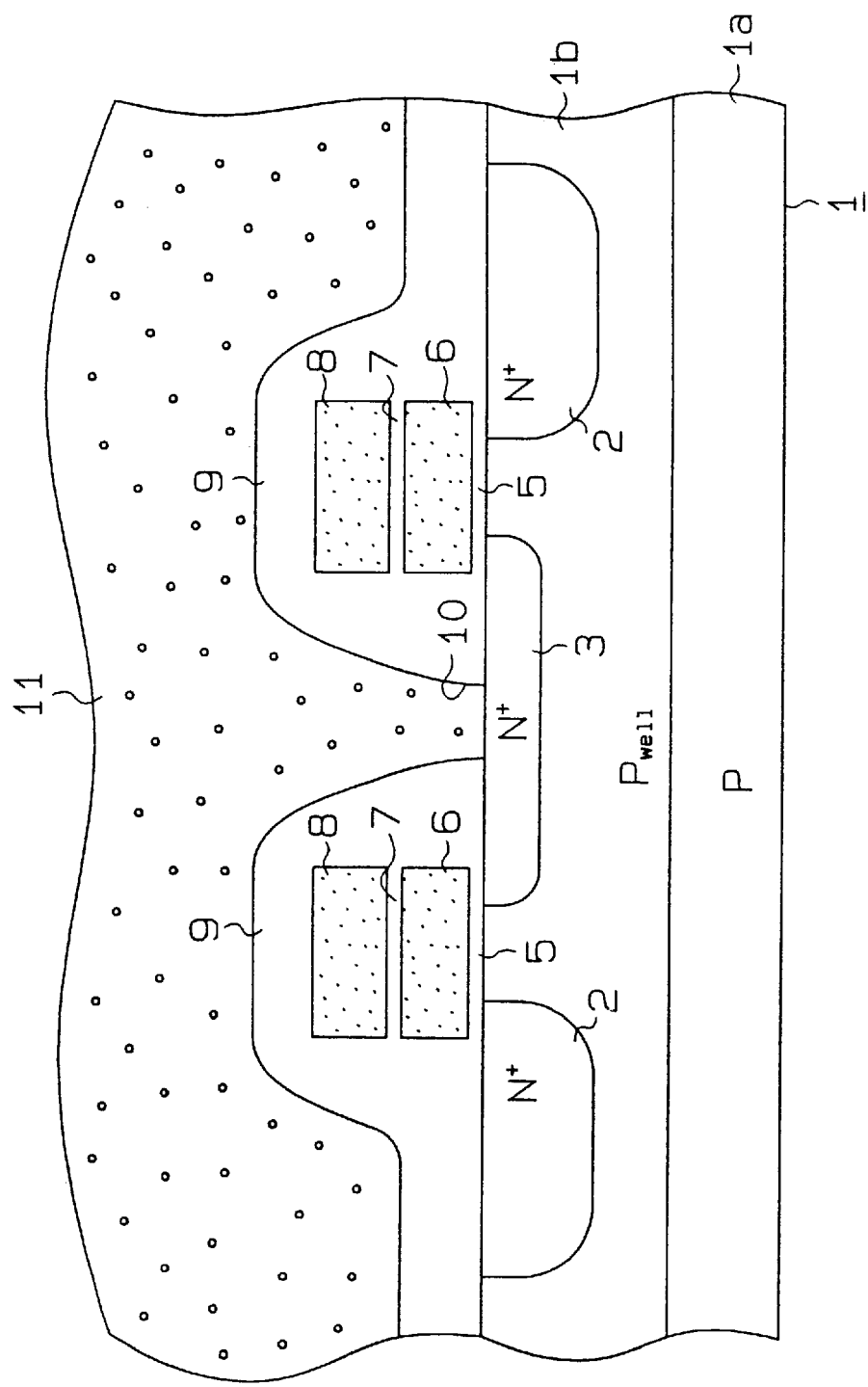
FIG. 2 is a cross-sectional view taken along line II—II in FIG. 1.

Referring first to FIG. 2, in a P type single crystal silicon substrate 1 as a semiconductor substrate, a P well layer 1b is provided on a P type silicon layer 1a. An N$^+$ type source region (impurity diffusion region) 2 and an N$^+$ type drain region (impurity diffusion region) 3 are provided in a surface portion of the P well layer 1b separately from each other for each memory cell. Further, as shown in FIG. 1, an N$^+$ source common line (impurity diffusion region) 4 extends in the P well layer 1b, and is connected to the source region 2 in each memory cell.

Further, referring back to FIG. 2, a floating gate electrode 6 made of poly-crystal silicon is disposed above the single crystal silicon substrate 1 through a thin silicon oxide film 5 as a tunnel film. The floating gate electrode 6 is rectangular and extends above a gap between the source region 2 and the drain region 3. A strip of control gate electrode 8 is disposed above the floating gate electrode 6 through a silicon oxide film (gate intermediate insulating film) 7 interposed therebetween. The control gate electrode 8 is made of poly-crystal silicon, and as shown in FIG. 1, extends in parallel with the source common line 4.

A silicon oxide film 9 is, as shown in FIG. 2, disposed on the single crystal silicon substrate 1 to cover the control gate electrode 8. A wiring member 11 made of aluminum for drain is disposed on the silicon oxide film 9, and is electrically connected to the drain region 3 through a contact hole (opening portion) 10 provided therein. In the present embodiment, two transistor cells have the one contact hole 10 in common for the drain region 3. Further, as shown in FIG. 1, wiring members (not shown) are electrically connected to the source common line 4 through contact holes (opening portions) 12a, 12b, 13a, 13b, which are provided in the silicon oxide film 9. The contact holes 12a, 12b, 13a, 13b are provided for eight transistor cells each in the present embodiment.

Figure 3:
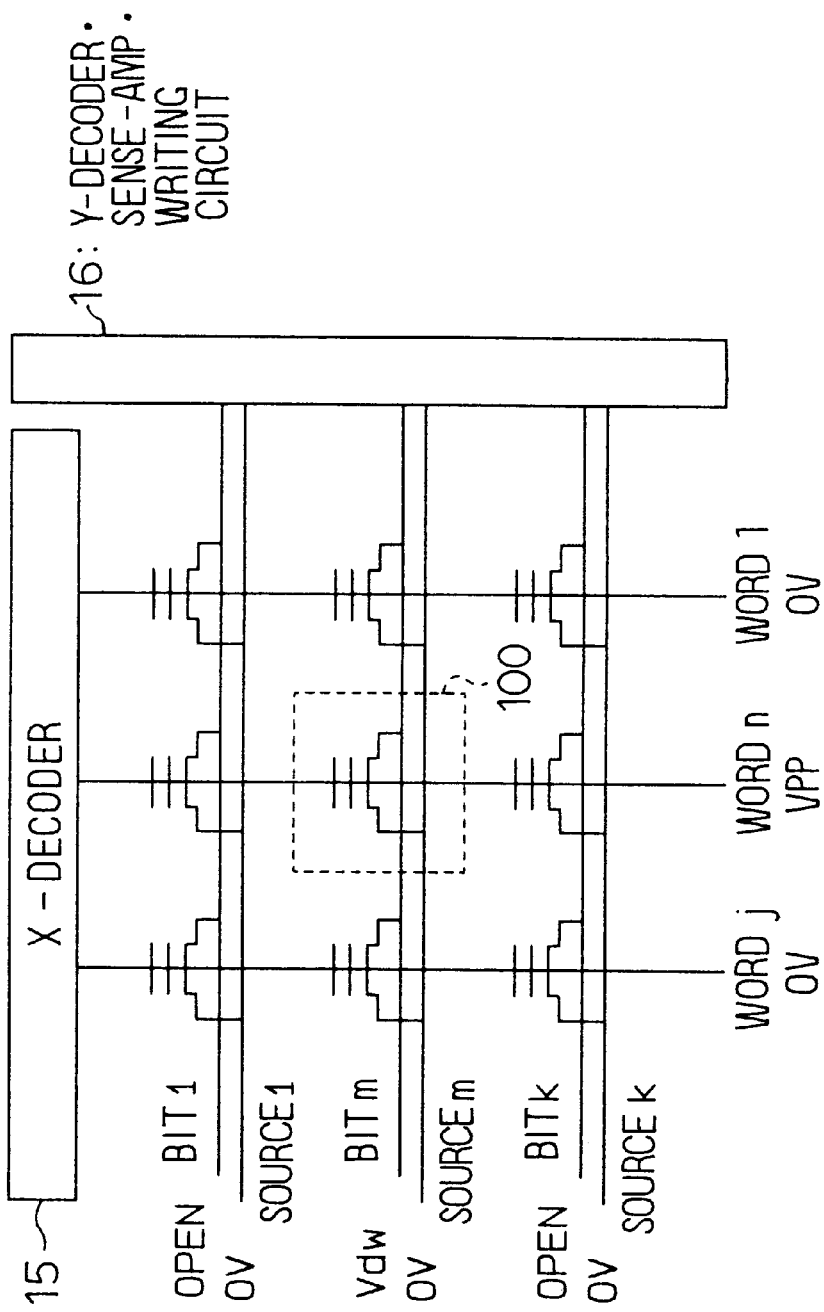
FIG. 3 is a circuit diagram showing an electrical constitution of a peripheral circuit.

FIG. 3 shows a peripheral circuit composed of an X decoder 15 and a Y-decoder·sense-amplifier·write circuit 16. The X decoder 15 is connected to the control gate electrode 8 in each cell via a word line 1, 2, 3 , . . . , n, j. The Y-decoder·sense-amplifier·write circuit 16 is connected to the drain region 3 in each cell via a bit line 1, 2, 3, . . . , m, k. The Y-decoder·sense-amplifier·write circuit 16 is further connected to the source region in each cell via a source line 1, 2, 3 , . . . , m, k.

Figure 9:
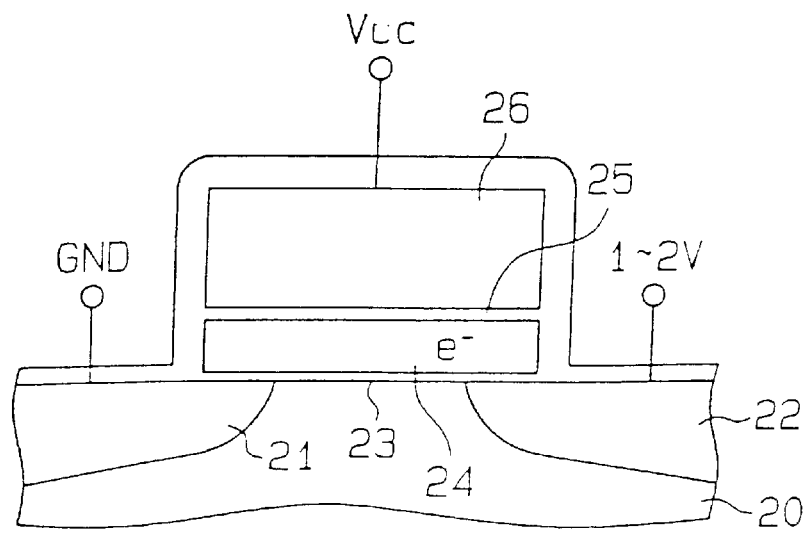
FIG. 9 is a cross-sectional view showing a memory, for explaining a reading operation.
Figure 10:
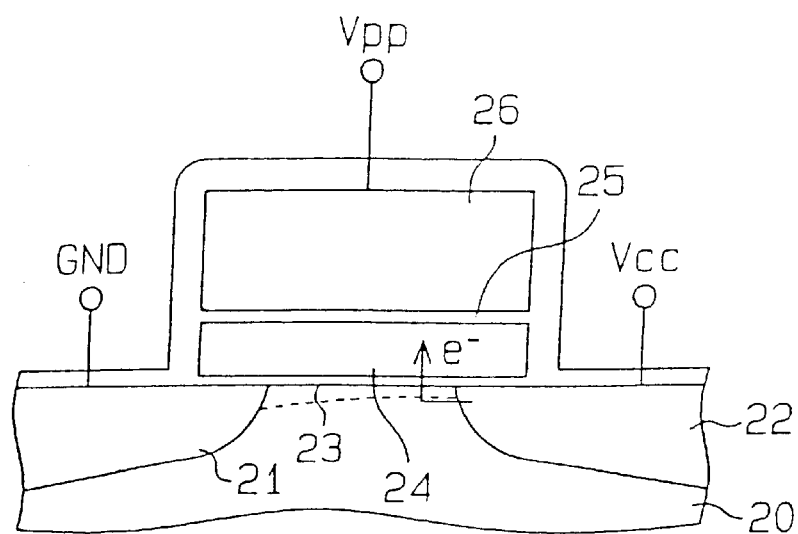
FIG. 10 is a cross-sectional view showing the memory, for explaining a writing operation.
Figure 11:
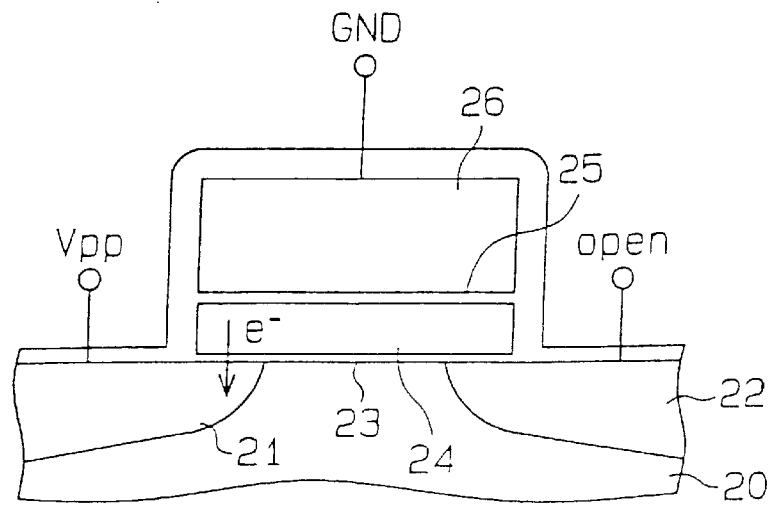
FIG. 11 is a cross-sectional view showing the memory, for explaining an erasing operation.
Figure 12:
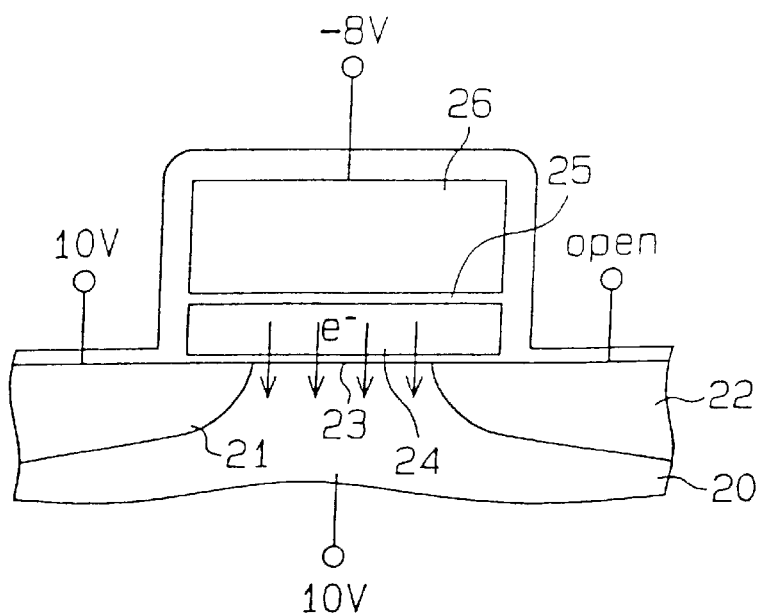
FIG. 12 is a cross-sectional view showing the memory, for explaining another erasing operation.

The operations of the flash memory, that is, the reading, writing, and erasing operations are substantially the same as those explained referring to FIGS. 9 to 11, and the explanations are omitted.

Next, a charge retention lifetime evaluation method for the flash memory constructed as above is explained. In the present embodiment, after performing a rewriting operation 100 times, a charge retention lifetime evaluation (test) is performed at an ambient temperature at which the damage caused to the tunnel film 5 by the rewriting operation is not eased. In this evaluation (test), the substrate 1 (P well region 1b) is set to have a ground potential and a voltage is applied to the control gate electrode 8 so that a voltage is applied to the tunnel film 5. Accordingly, an accelerated evaluation can be performed. Further, in this test, the retention, i.e., the charge retention property is evaluated by measuring a change in threshold voltage Vt.

Figure 4:
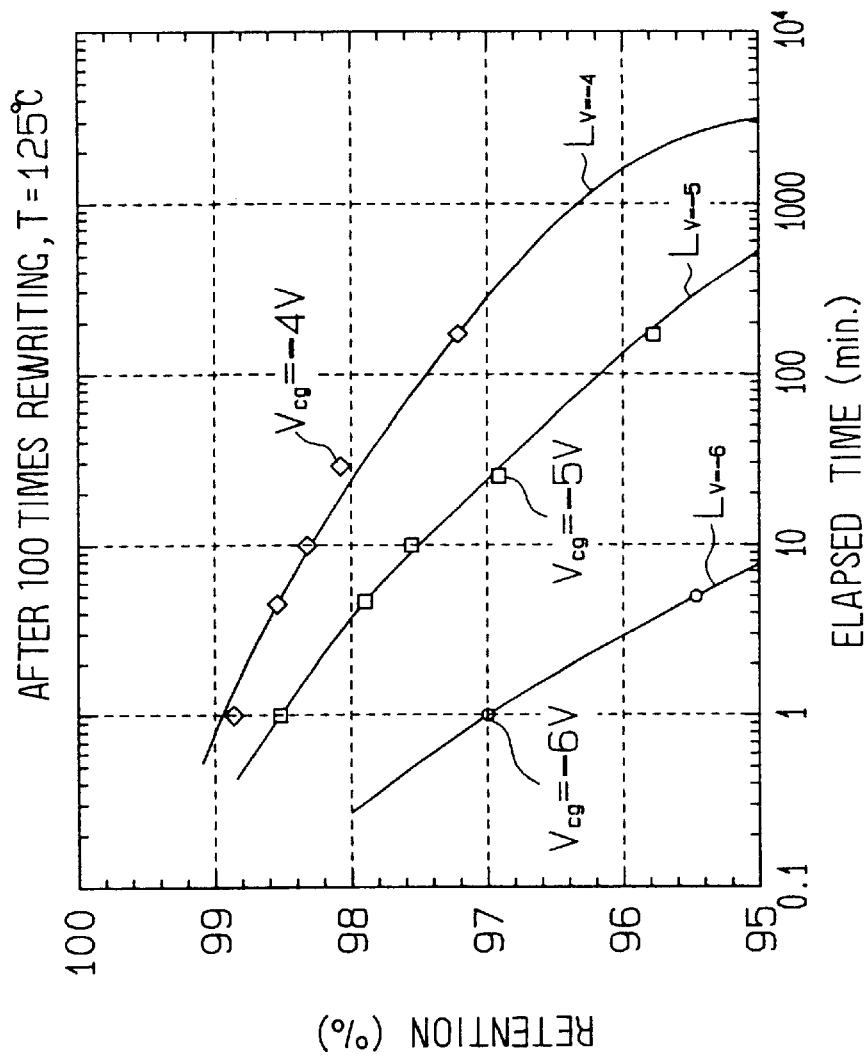
FIG. 4 is a graph for explaining a charge retention lifetime evaluation method.

Hereinafter, the evaluation method is explained referring to FIGS. 4 and 5. In FIG. 4, a horizontal axis indicates elapsed time, and a vertical axis indicates retention (rate of change in threshold voltage).

First, the retention (rate of decrease in threshold voltage) is measured with respect to the elapsed time while keeping a state in which a first voltage is applied across the control gate electrode 8 and the substrate 1 as control gate voltage Vcg (Vcg=−4 V in FIG. 4) at 125° C. Next, the retention (the rate of decrease in threshold voltage) is measured while keeping a state in which a second voltage (Vcg=−5 V in FIG. 4) different from the first voltage is applied across the control gate electrode 8 and the substrate 1 at 125° C. Further, the retention (rate of decrease in threshold voltage) is measured while keeping a state in which a third voltage (Vcg=−6 V in FIG. 4) different from the first and second voltages is applied across the control gate electrode 8 and the substrate 1 at 125° C.

That is, in the memory transistor, the writing operation is performed after the rewriting operation is performed a necessitated number of times. Then, three different voltages of −4 V, −5 V, and −6 V are respectively applied to the control gate electrode 8, and the change in threshold voltage is measured in each case at 125° C.

Here, the voltage applied to the control gate electrode 8 is a negative bias such that electrons are extracted from the floating gate electrode 6. Each of the three (at least two) different voltages applied to the control gate electrode 8 between the control gate electrode 8 and the substrate 1 is negative and does not exceed a voltage applied when the memory is operated.

More specifically, the voltage is applied to the control gate electrode 8 so that a voltage applied to the tunnel film 5 accordingly is smaller than any one of the voltages that are applied to the tunnel film 5 at the writing, erasing, and reading operations. That is, the maximum voltage applied to the tunnel film 5 at the accelerated test for charge retention is controlled to be smaller than the maximum voltage that is applied to the tunnel film 5 when data is rewritten. Because of this, the tunnel film 5 is prevented from being damaged during the evaluation. Therefore, the tunnel film 5 does not deteriorate by the test.

To obtain (sample) the data shown in FIG. 4, the threshold voltage is measured in an elapsed time range of approximately 1 min. to approximately 200 min. Then, in FIG. 4, the lifetime (elapsed time) when the threshold voltage is decreased to 95% is determined in each of the cases in which the voltages of −4 V, −5 V, and −6 V are respectively applied to the control gate electrode. Hereinafter, the lifetime when the threshold voltage is decreased to 95% is referred to as a 95% retention lifetime (time). That is, as shown in FIG. 4, curve $L_{V=-4}$ is drawn to approximate plotted points when the control gate voltage Vcg=−4 V. Similarly, curve $L_{V=-5}$ is drawn to approximate plotted points when the control gate voltage Vcg=−5 V, and curve $L_{V=-6}$ is drawn to approximate plotted points when the control gate voltage Vcg is −6 V. Then, the 95% retention lifetime (time) is determined with respect to each curve $L_{V=-4}$, $L_{V=-5}$, or $L_{V=-6}$. Specifically, in FIG. 4, the 95% retention lifetimes are approximately 3000 hours under Vcg=−4 V, approximately 500 hours under Vcg=−5 V, and approximately 8 hours under Vcg=−6 V.

Thus, at least two different voltages are respectively applied to the control gate electrode 8, and the charge retention property is measured in each case.

On the other hand, in each of the cases where the voltages of −4 V, −5 V, and −6 V are respectively applied to the control gate electrode 8, a field intensity applied to the tunnel film 5 is calculated by a capacity coupling rate. Specifically, the voltage V applied to the tunnel film 5 is represented by the following formula of;

$$V = \frac{C1}{C1+C2}Vcg + \frac{Qf}{C1+C2} \quad (1)$$

where C1 is an electrostatic capacitance between the control gate electrode 8 and the floating gate electrode 6, C2 is an electrostatic capacitance between the floating gate electrode 6 and the substrate 1, and Qf is an amount of charge in the floating gate electrode 6. The electrostatic capacitances C1 and C2 largely depend on longitudinal and lateral dimensions of the memory transistor structure, and are represented by the following formulas of;

$$C1 = \epsilon'\epsilon_0 \frac{S'}{t'} \quad (2)$$

$$C2 = \epsilon'\epsilon_0 \frac{S}{t} \quad (3)$$

where $\epsilon_0$ is a dielectric constant under vacuum, $\epsilon'$ is a dielectric constant of the oxide film, S' is an area of an overlapping region between the control gate electrode and the floating gate electrode, t' is a thickness of the intermediate film between the control gate electrode and the floating gate electrode, S is an area of an overlapping region between the floating gate electrode and the tunnel film, and t is a thickness of the tunnel film.

The values of C1 and C2 can be determined by the formulas (2) and (3) based on the memory transistor structure, and Qf also can be determined. Then, the voltage applied to the tunnel film 5 is calculated at each voltage Vcg by the formula (1) by substituting −4 V, −5 V, and −6 V, respectively, for the value of the voltage Vcg. Then, the value of the voltage is divided by the thickness t of the tunnel film 5. As a result, the field intensity of the tunnel film 5 is determined.

Thus, the 95% retention lifetimes (time) and the field intensities of the tunnel film 5 when Vcg=−4 V, −5 V, and −6 V can be obtained. These values are plotted as shown in FIG. 5, thereby revealing a relation of the charge retention lifetime with respect to the field intensity of the tunnel film 5. The 95% retention lifetime when Vcg=0 (applied voltage is zero) is extrapolated based on the plotted result. That is, the lifetime when the voltage applied to the control gate electrode 8 is zero is calculated as the charge retention lifetime at an ambient temperature of 125° C.

Figure 5:
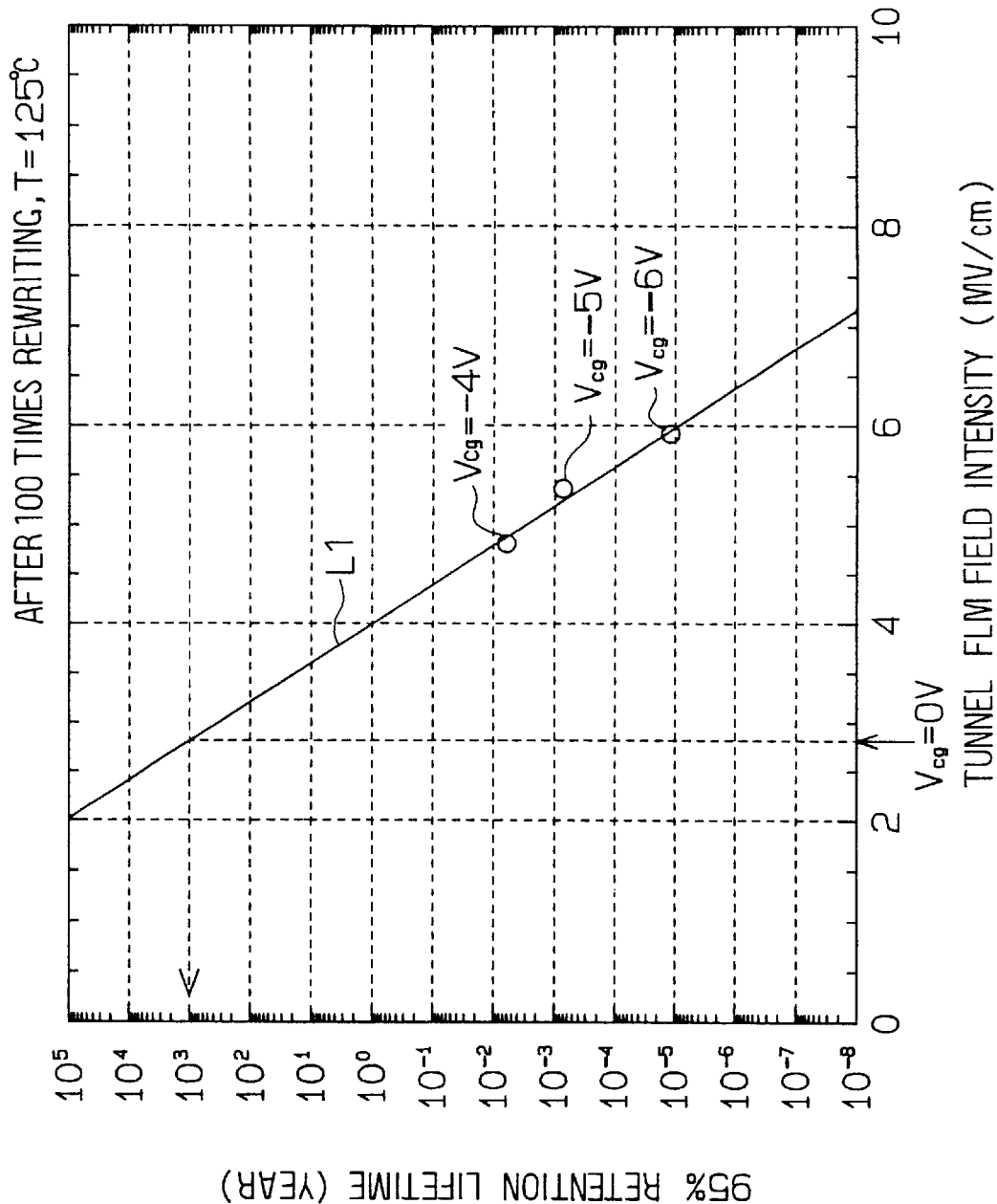
FIG. 5 is a graph for explaining the charge retention lifetime evaluation method.

Specifically, in FIG. 5, when Vcg=0, the tunnel film field intensity is 2.8 MV/cm. Line $L_1$ is drawn to approximate plotted points, and the 95% retention lifetime when Vcg=0 is extrapolated by the line $L_1$. In FIG. 5, the 95% retention lifetime under no applied voltage is approximately 1000 years.

Thus, the charge retention lifetime evaluation is performed on the memory by the accelerated test in which the voltage is applied to the control gate electrode 8 at the temperature (for instance, 125° C.) that cannot recover the damage, which is caused to the tunnel film 5 by the data rewriting, during the charge retention lifetime evaluation. Accordingly, the evaluation time can be shortened. Further, since the damages are not recovered, the evaluation can be performed accurately when the charge retention test is performed after rewriting data.

The effects of the present embodiment are explained below in comparison with a case in which no voltage is applied across the control gate electrode and the substrate.

Figure 6:
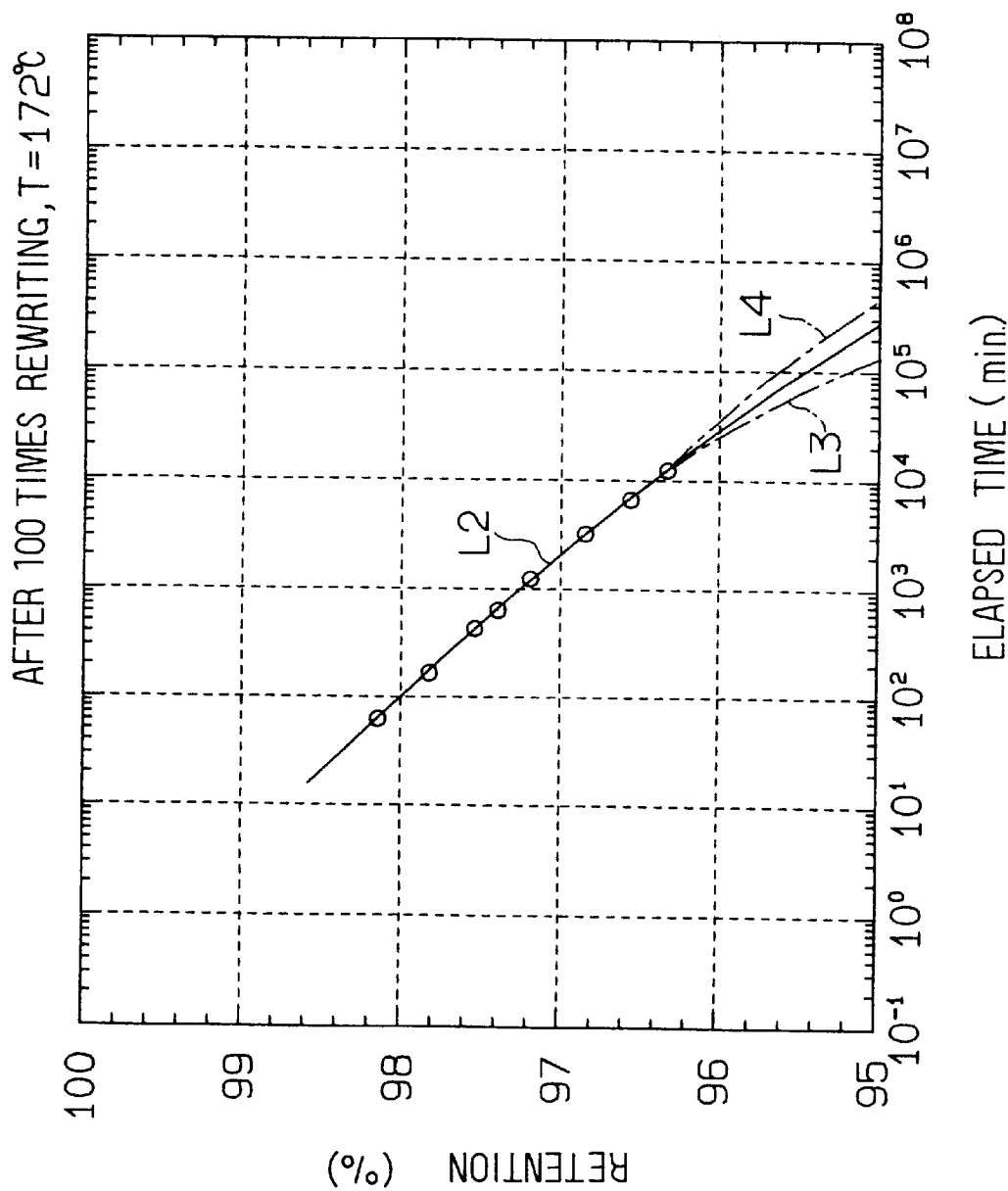
FIG. 6 is a graph for explaining the charge retention lifetime evaluation method.
Figure 7:
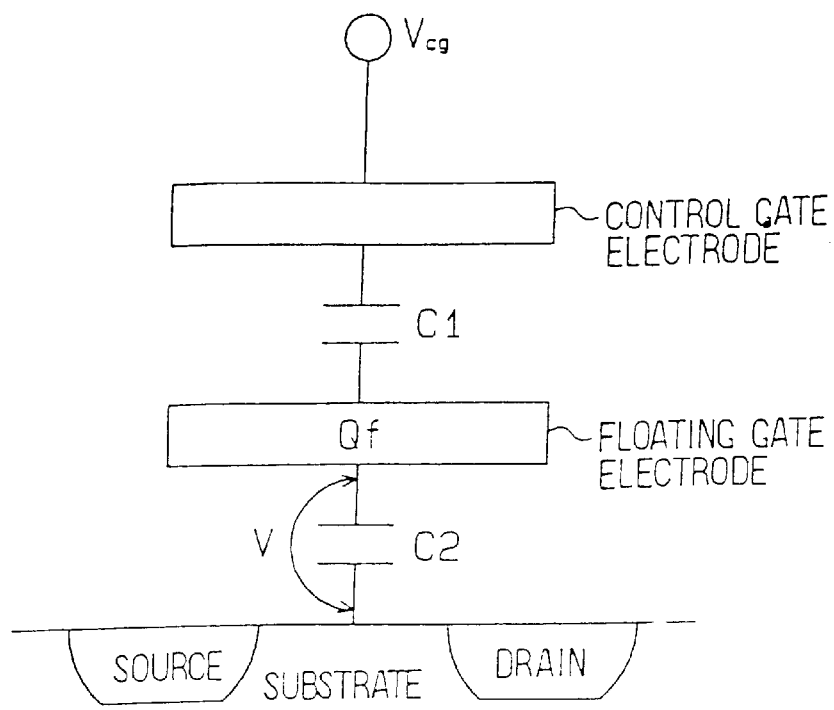
FIG. 7 is a diagram showing the electrical circuit equivalent of a memory cell.
Figure 8:
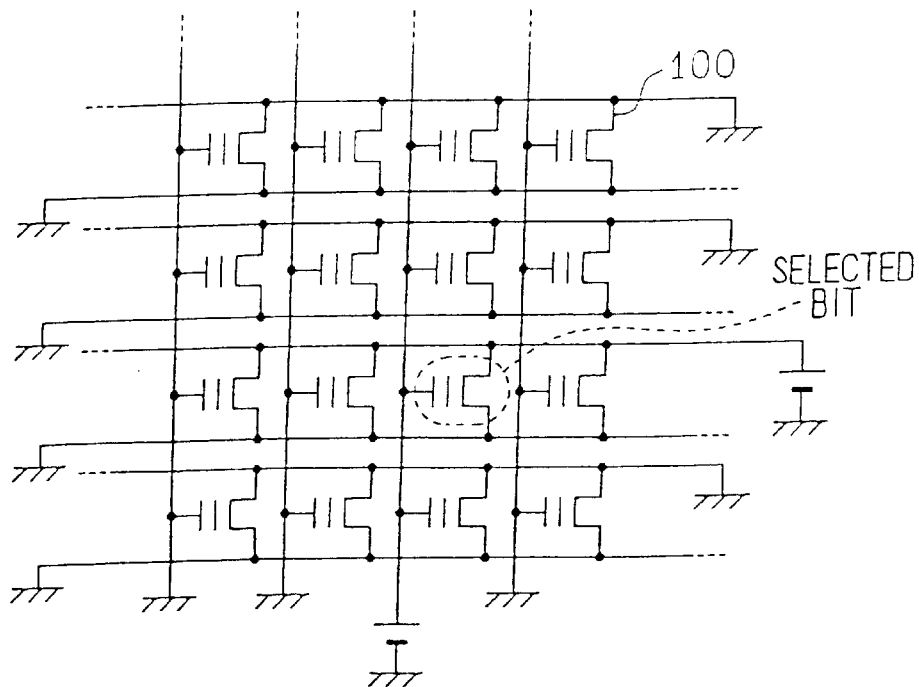
FIG. 8 is a diagram showing a cell arrangement of a flash memory.

FIG. 6 shows a retention measurement result when no voltage is applied across the control gate electrode and the substrate. Incidentally, the ambient temperature in FIG. 6 is 172° C. FIG. 6 corresponds to FIG. 4, and the threshold voltage is measured in an elapsed time range of approximately 7 min. to approximately 10000 min. In FIG. 6, curve $L_2$ (indicated with a solid line) is drawn to pass through eight plotted points. Accordingly, approximately $3 \times 10^5$ min. is extrapolated as a 95% retention lifetime.

If the 95% retention lifetime is not calculated by the extrapolation of the curve $L_2$ passing through the plotted points but is evaluated directly, however, the evaluation requires a very long period of time, i.e., $3 \times 10^5$ min.= approximately 6.9 months. Even if the 95% retention lifetime is determined by the extrapolation, approximately 10000 min. (=approximately 1 week) is required as an evaluation period of time for sampling the data. In addition, since the extrapolation is utilized, as indicated by chain lines $L_3$ and $L_4$ in FIG. 6, errors are liable to occur due to how the curve is extrapolated, resulting in a calculation error of the 95% retention lifetime.

As compared to that, in FIG. 4, the test period of time for evaluation (sampling time) can be set in a range of approximately 1 min. to 200 min. by controlling the control gate voltage appropriately. As to the calculation accuracy of the lifetime, the data can be measured (sampled) directly in a range very close to 95%. Even when the 95% retention lifetime is measured directly, approximately 3000 min. or less is sufficient for the test period of time (sampling time) in FIG. 4. Thus, the estimation can be performed accurately for a short time by applying the voltage between the substrate 1 and the control gate electrode 8.

The present embodiment described above has the following features.

When the charge retention lifetime is evaluated after rewriting data, accelerated evaluation is performed by intentionally applying a voltage to the tunnel film 5. Accordingly, the charge retention lifetime evaluation can be performed for a short time even at a temperature atmosphere where rewriting damage to the tunnel film 5 is not recovered. Since the damage to the tunnel film 5 is not recovered, the evaluation can be performed accurately, and for a short time due to the acceleration by the applied voltage.

More specifically, it is not preferable to determine the charge retention property when no voltage is applied by applying at least two voltages. That is, as shown in FIG. 4, at least two negative voltages are applied to the control gate electrode 8 while making the substrate 1 grounded so that a voltage, which does not exceed the voltage applied to the tunnel film 5 when the memory is operated, is applied to the tunnel film 5 between the control gate electrode 8 and the substrate 1. Then, the charge retention properties with respect to the field intensities of the tunnel film 5 are revealed by a capacity coupling rate in the cases where at least the two voltages are applied. Then, as shown in FIG. 5, the charge retention property when no voltage is applied to the control gate electrode 8 (when no voltage is applied across the control gate electrode 8 and the substrate 1) is estimated. Therefore, this method is not preferable.

The application of the voltage in the test (evaluation performed applying the voltage to the tunnel film 5) is performed by grounding the substrate 1 and by applying the negative voltage to the control gate electrode 8. However, it is not limited to that, but may be performed by applying a positive voltage to the source, the substrate, or the drain, provided that the control gate electrode 8 has an electric potential lower than that of the substrate 1 between the control gate electrode 8 and the substrate 1, i.e., provided that electrons are extracted.

The evaluation atmosphere described above has a temperature of 125° C., which does not recover the damage to the tunnel film 5. However, the temperature of the evaluation atmosphere may be further raised in a range not recovering the damage to the tunnel film 5. Accordingly, the period of time can be further shortened by raising the temperature more in the range not recovering the damages of the tunnel film 5, as compared to that at the lower temperature in the same range.

Further, in the above explanation, although the charge retention lifetime is evaluated after rewriting data, the charge retention lifetime may be evaluated without rewriting data. In this case, the period of time for evaluating the charge retention lifetime can be further shortened, and the evaluation ambient temperature is arbitrary. The present invention can be applied to various nonvolatile semiconductor memories such as an EEPROM, an EPROM, and an MNOS memory, in addition to the flash memory.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A charge retention lifetime evaluation method for a nonvolatile semiconductor memory, said method comprising:
    preparing a nonvolatile semiconductor memory having a semiconductor substrate, source and drain regions, which are provided in a surface portion of the semiconductor substrate separately from each other, a floating gate electrode provided above the semiconductor substrate between the source and drain regions through a tunnel film, and a control gate electrode provided above the floating gate electrode through an insulating film;
    evaluating a charge retention lifetime by externally applying a tunnel film voltage to the tunnel film, and
    wherein the charge retention lifetime is an elapsed time during which a threshold voltage corresponding to a threshold of the nonvolatile semiconductor memory decreases to a lesser percentage.

2. The charge retention lifetime evaluation method of claim 1, wherein the charge retention lifetime when a third voltage externally applied as the tunnel film voltage is substantially zero is estimated by externally applying at least first and second voltages to the tunnel film, respectively, the first and second voltages being different from each other.

3. The charge retention lifetime evaluation method of claim 1, wherein an electric potential of the control gate electrode is set to be lower than that of the semiconductor substrate so that the tunnel film voltage is applied to the tunnel film.

4. The charge retention lifetime evaluation method of claim 1, wherein the semiconductor substrate is grounded and a negative voltage is applied to the control gate electrode when the tunnel film voltage is applied to the tunnel film.

5. The charge retention lifetime evaluation method of claim 1, wherein a magnitude of the tunnel film voltage applied to the tunnel film is smaller than that of a voltage applied to the tunnel film when a reading operation is performed to the nonvolatile semiconductor memory.

6. The charge retention lifetime evaluation method of claim 1, wherein a magnitude of the tunnel film voltage applied to the tunnel film is smaller than that of a voltage applied to the tunnel film when a writing operation is performed to the nonvolatile semiconductor memory.

7. The charge retention lifetime evaluation method of claim 1, wherein a magnitude of the tunnel film voltage applied to the tunnel film is smaller than that of a voltage applied to the tunnel film when an erasing operation is performed to the nonvolatile semiconductor memory.

8. The charge retention lifetime evaluation method of claim 1, wherein the tunnel film voltages is determined by a capacity coupling rate based on a voltage applied across the control gate electrode and the semiconductor substrate.

9. The charge retention lifetime evaluation method of claim 8, wherein the tunnel film voltage V is represented by a formula of:

$$V = \frac{C1}{C1+C2}Vcg + \frac{Qf}{C1+C2}$$

in which
    C1 is an electrostatic capacitance between the control gate electrode and the floating gate electrode;
    C2 is an electrostatic capacitance between the floating gate electrode and the semiconductor substrate;
    Qf is an amount of charge in the floating gate electrode; and
    Vcg is the voltage externally applied across the control gate electrode and the semiconductor substrate.

10. The charge retention lifetime evaluation method of claim 1, wherein the charge retention lifetime is evaluated after writing, erasing, and rewriting of data are performed to the nonvolatile semiconductor memory.

11. The charge retention lifetime evaluation method of claim 1, further comprising writing data into the nonvolatile semiconductor device so that damages are caused to the tunnel film, before evaluating the charge retention lifetime,
    wherein the tunnel film voltage is applied to the tunnel film at a temperature lower than a temperature capable of recovering the damages.

12. The charge retention lifetime evaluation method of claim 11, wherein the tunnel film voltage is applied to the tunnel film at the temperature equal to or higher than 125° C.

13. The charge retention lifetime evaluation method of claim 1, wherein the tunnel film voltage is applied to the tunnel film in an operational temperature range where the nonvolatile semiconductor memory is practically used.

14. The charge retention lifetime evaluation method of claim 13, wherein the tunnel film voltage is applied to the tunnel film at a maximum temperature in the operational temperature range where the nonvolatile semiconductor memory is practically used.

15. The charge retention lifetime evaluation method of claim 1, wherein a magnitude of the tunnel film voltage applied to the tunnel film is smaller than every voltage applied to the tunnel film when a reading operation, a writing operation, and an erasing operation are respectively performed on the nonvolatile semiconductor memory.

16. A charge retention lifetime evaluation method for a nonvolatile semiconductor device, said method comprising:

preparing a nonvolatile semiconductor memory having a semiconductor substrate, source and drain regions, which are provided in a surface portion of the semiconductor substrate separately from each other, a floating gate electrode provided above the semiconductor substrate between the source and drain regions through a tunnel film, and a control gate electrode provided above the floating gate electrode through an insulating film;

writing data into the nonvolatile semiconductor memory;

measuring a first charge retention property of the written data at a first voltage by applying the first voltage externally to the tunnel film;

measuring a second charge retention property of the written data at a second voltage by applying the second voltage externally to the tunnel film, the second voltage being different from the first voltage; and estimating a charge retention lifetime of the written data when a third voltage smaller than the first and second voltages is externally applied to the tunnel film, by the first and second charge retention properties.

17. The charge retention lifetime evaluation method of claim 16, wherein the third voltage is zero.

18. The charge retention lifetime evaluation method of claim 16, wherein fourth and fifth voltages different from each other are respectively applied to the control gate electrode in a state where the semiconductor substrate is grounded so that the first and second voltages are respectively applied to the tunnel film.

19. The charge retention lifetime evaluation method of claim 18, wherein the first and second voltages are respectively calculated by a formula of:

$$V = \frac{C1}{C1+C2}Vcg + \frac{Qf}{C1+C2}$$

in which

C1 is an electrostatic capacitance between the control gate electrode and the floating gate electrode;

C2 is an electrostatic capacitance between the floating gate electrode and the semiconductor substrate;

Qf is an amount of charge in the floating gate electrode; and

Vcg is a corresponding one of the fourth and fifth voltages applied across the control gate electrode and the semiconductor substrate.

20. The charge retention lifetime evaluation method of claim 16, wherein magnitudes of the first and second voltages are smaller than that of a voltage applied to the tunnel film during a reading operation of the nonvolatile semiconductor memory.

21. The charge retention lifetime evaluation method of claim 16, wherein magnitudes of the first and second voltages are smaller than that of a voltage applied to the tunnel film during a writing operation of the nonvolatile semiconductor memory.

22. The charge retention lifetime evaluation method of claim 16, wherein magnitudes of the first and second voltages are smaller than that of a voltage applied to the tunnel film during an erasing operation of the nonvolatile semiconductor memory.

23. The charge retention lifetime evaluation method of claim 16, wherein the first and second voltages are respectively applied at temperatures in an operational temperature range at which the nonvolatile semiconductor memory is practically used, to evaluate the first and second charge retention properties.

24. The charge retention lifetime evaluation method of claim 23, wherein the first and second voltages are respectively applied at a maximum temperature in the operational temperature range at which the nonvolatile semiconductor memory is practically used.

25. The charge retention lifetime evaluation method of claim 23, wherein the first and second voltages are applied at a same temperature.

26. The charge retention lifetime evaluation method of claim 16, wherein magnitudes of the first and second voltages are smaller than every voltage applied to the tunnel film during a reading operation, a writing operation, and an erasing operation performed at the nonvolatile semiconductor memory.

27. The charge retention lifetime evaluation method of claim 16, wherein the first and second voltages are applied to the tunnel film respectively at first and second temperatures that are equal to or higher than 125° C.

28. The charge retention lifetime evaluation method of claim 27, wherein the first and second temperatures are equal to each other.

29. The charge retention lifetime evaluation method of claim 27, wherein the first and second temperatures are lower than a temperature capable of recovering damages to the tunnel film produced when the data is written into the nonvolatile semiconductor memory.

30. A charge retention lifetime evaluation method for a nonvolatile semiconductor memory, said method comprising:

preparing a nonvolatile semiconductor memory having a semiconductor substrate, source and drain regions, which are provided in a surface portion of the semiconductor substrate separately from each other, a floating gate electrode provided above the semiconductor substrate between the source and drain regions through a tunnel film, and a control gate electrode provided above the floating gate electrode through an insulating film;

evaluating a charge retention lifetime by externally applying a tunnel film voltage to the tunnel film; and wherein the charge retention lifetime when a third voltage externally applied as the tunnel film voltage is substantially zero is estimated by externally applying at least first and second voltages to the tunnel film, respectively, the first and second voltages being different from each other.

* * * * *